United States Patent
Cohn et al.

(10) Patent No.: US 6,537,852 B2
(45) Date of Patent: Mar. 25, 2003

(54) SPACER - CONNECTOR STUD FOR STACKED SURFACE LAMINATED MULTICHIP MODULES AND METHODS OF MANUFACTURE

(75) Inventors: David Leslie Cohn, Austin, TX (US); Dennis Jay McBride, Wake Forest, NC (US); Robert Kevin Montoye, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/935,300

(22) Filed: Aug. 22, 2001

(65) Prior Publication Data

US 2003/0038373 A1 Feb. 27, 2003

(51) Int. Cl.[7] .......................... H01L 21/44; H01L 21/48
(52) U.S. Cl. .......................................... 438/109
(58) Field of Search ................... 438/109, 660, 438/106, 107, 108, 126, 14, 597, 612

(56) References Cited

U.S. PATENT DOCUMENTS

| | | | |
|---|---|---|---|
| 4,868,712 A | 9/1989 | Woodman | 361/388 |
| 5,111,279 A | 5/1992 | Eichelberger | 357/75 |
| 5,130,894 A | 7/1992 | Miller | 361/393 |
| 5,200,631 A | 4/1993 | Austin et al. | 257/81 |
| 5,600,541 A * | 2/1997 | Bone et al. | 361/707 |
| 5,701,233 A | 12/1997 | Carson et al. | 361/735 |
| 5,745,333 A | 4/1998 | Frankeny et al. | 361/313 |
| 5,766,825 A | 6/1998 | Shirai et al. | 430/327 |
| 5,856,915 A | 1/1999 | Weinberg | 361/790 |
| 5,883,426 A | 3/1999 | Takuno et al. | 257/686 |
| 6,002,177 A | 12/1999 | Gaynes et al. | 257/774 |
| 6,014,313 A | 1/2000 | Hesselbom | 361/704 |
| 6,014,320 A | 1/2000 | Mahon et al. | 361/803 |
| 6,051,878 A | 4/2000 | Akram et al. | 257/686 |

* cited by examiner

Primary Examiner—Matthew Smith
Assistant Examiner—Igwe Anya
(74) Attorney, Agent, or Firm—Morgan & Finnegan; Joscelyn G. Cockburn

(57) ABSTRACT

A spacer-connector stud comprises a stacked array of glass epoxy laminates, each laminate having a copper layer laminated thereto. The top and bottom laminates of the stud include a spatial array of thermal contacts suitable as a footprint for C4 bump technology. A location is selected on a circuitized base card to accommodate the laminated stud. The stud has a thickness greater than twice the thickness of the components attached to the card. The thermal contacts on the stud, typically solderable, join to a wiring array on the card. A second multi-chip module card having attached and interconnected components on both sides of the second card is mechanically aligned with the based card and pressed against the contacts on the top layer of the stud to form an assembly. The assembly is heated causing the second card to become soldered to the contact footprint on the stud.

15 Claims, 4 Drawing Sheets

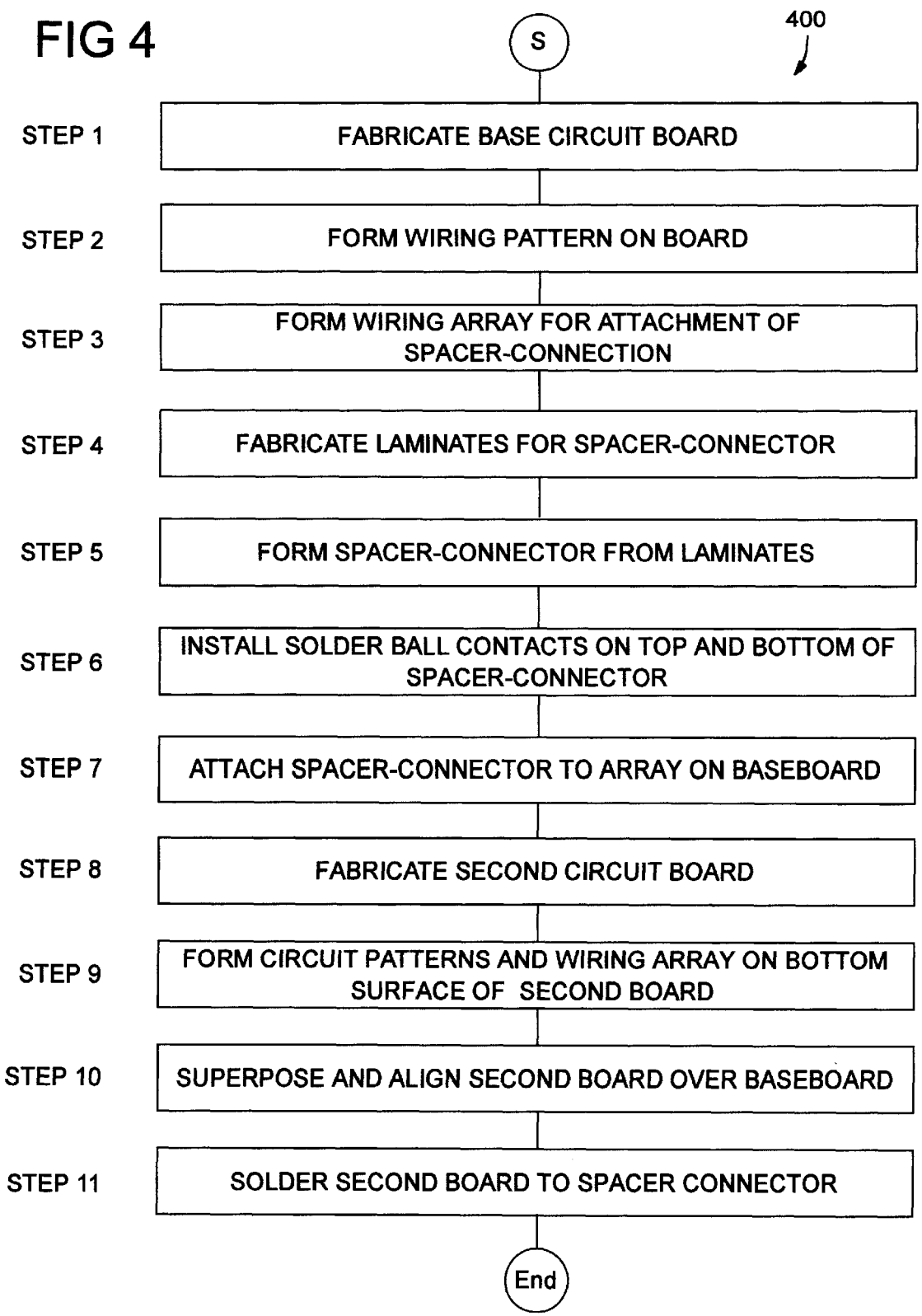

SPACER - CONNECTOR STUD FOR STACKED SURFACE LAMINATED MULTICHIP MODULES AND METHODS OF MANUFACTURE

BACKGROUND OF INVENTION

1. Field of Invention

This invention relates to surface laminated circuit (SLC) components, and methods of manufacture. More particularly, the invention relates to spacer-connector studs for stacked SLC multi chip modules and methods of manufacture.

2. Description of Prior Art

A Surface Laminated Circuit (SLC) printed circuit board has successively laminated copper clad glass-epoxy laminations as a substrate. A photosensitive epoxy resin serves as an insulating layer and a copper plated layer as an external-conducting surface. SLC type circuit boards are described in U.S. Pat. No. 5,766,825 assigned to the assignee of the present invention and fully incorporated herein. Electronic components, e.g Random Access Memory (RAM); Read Only Memory (ROM); Integrated Circuits (IC), etc. may be modularized and attached to the Lipper and lower surfaces of the SLC board by solder ball reflow joininig techniques. The attached modules may be interconnected through the conductive layer of the upper and lower surfaces of the board.

It is desirable to stack the SLC boards to save component space and shorten the signal paths between the boards. The stacked array of boards requires that the boards be positively spaced apart to prevent contact of the components attached to the board. Moreover, signal paths of the boards must be interconnected without disturbing any of the solder ball connections between components and the SLC boards. The spacing and interconnecting of the boards must be inexpensive and suitable for assembly line manufacture What is needed in the art is a component, which serves as a spacer for separating the SLC boards and at the same time providing a dense array of signal paths that can be routed through the spacer for interconnecting the modules on the spaced SLC boards.

Prior art related to stacked multi-chip modules includes:

U.S. Pat. No. 6,014,313 entitled "Packaging Structure for Integrated Circuits" by H. Hesselbom, issued Jan. 11, 2000 discloses a three-dimensional multi-chip module formed as a s%tack of two-dimensional multi-chip modules comprising substrates which have electrically signal paths connecting integrated circuit chips and has vertical interconnections of the signal paths, provided by interconnection or via chips. The individual chips or other inner components on a substrate are in mechanical contact with a surface of an adjacent substrate and constitute the distance device maintaining the substrates spaced from each other. Thus heat developed in components can be conducted essentially perpendicularly to the substrates. Thermally conducting chips can be used for improving the conducting of heat. Cooling devices are located only at the top and bottom surfaces of the stack. Channels are formed between the chips and components which can be used for cooling and furthermore spaces are formed at the edges of the substrates in which electrical connectors can be inserted for coupling the stack to a similar stack, since there are no cooling devices at the lateral surfaces of the stack. The components of the stack are maintained in a detachable manner in electrical and mechanical contact with each other by applying a compressive force and by using elastic connecting and guiding devices. In particular bumps can be arranged cooperating with edge surfaces of components to guide components to correct positions.

U.S. Pat. No. 5,130,894 entitled "Three-Dimensional Circuit Modules" by W. H. Miller, issued Jul. 14, 1992 discloses a three-dimensional circuit structure particularly useful in semiconductor memories. The circuit structure consists of a stack of modules mounted on a motherboard with connectors between adjacent modules in the stack. The connectors mate with staggered and through terminals on the modules; the staggered terminals being used for circuits routed to destinations on specific modules and the through terminals for circuits routed to destinations on more than one module.

U.S. Pat. No. 5,111,278 entitled "Three-Dimensional Multi-Chip Module Systems" by C. W. Eichelberger, issued May 5, 1992 discloses a multichip integrated circuit packages and methods of fabrication, along with systems for stacking such packages. In one embodiment, the multichip package has an array of contact pads on an tipper surface thereof and an array of contact pads on a lower surface thereof. Connection means are provided for electrically coupling at least some of the contact pads on each package surface with selected ones of the contact pads on the other surface, or selected interconnection metallization which is disposed between integrated circuits located within the package. The contact pads of each surface array are preferably equal in number and vertically aligned such that multiple multichip packages may be readily stacked, with a conductive means disposed therebetween for electrically coupling the contact pads of one package to the pads of another package. In addition, various internal and external heat sink structures are provided which facilitate dissipation of heat in a multichip package or in a stack of multichip packages.

None of the prior art discloses a stacked array of SLC multi-chip modules including a spacer and interconnector comprising at least two glass-epoxy dielectric laminates with interconnecting circuit patterns for spacing and interconnecting the SLC multi-chip modules without disturbing any of the existing connections between the multi-clip modules and the SLC boards.

SUMMARY OF INVENTION

A stacked array of multi-chip modules cards are interconnected through a surface laminated stud which serves as an interconnector and spacer for the stacked multi-chip modules cards. The stud comprises a stacked array of glass epoxy laminates, each laminate having a copper layer laminated thereto. A circuitization pattern is formed in the copper layer by selected etching. Drilled and plated through holes within the laminates can carry many signals between laminates plus power and ground lines. A photosensitive thermal-setting resin insulating layer is applied atop the wiring layer. The resin-insulating layer is formed by applying a solution of soluble photosensitive, thermal-setting resins in a solvent atop the wiring layer. The solvent resins are evaporated by a pre-cure heating. The heating step serves to drive off the solvent and solidify the resins' insulating layer. The resin layer is planarized by abrasion. The top and bottom laminates of the stud may include a spatial array of thermal contacts suitable for C4 bump technology. A location is selected on the card to accommodate the laminated stud. The thickness of the stud is greater than twice the thickness of the components attached to the card The thermal contacts on the stud, typically solderable, join to the circuit patterns on the multi-chip module card. A second multi-chip module card having components on top and bottom surface is mechanically aligned and pressed against the contacts on top surfaces of the stud to form an assembly. The assembly can be heated causing the second card to become soldered to the contact footprint on the stud. A solder hierarchy may be employed such that overlying circuit board and stud does not reflow when the bottom surface of the stud is joined to the underlying circuit board.

DESCRIPTION OF THE DRAWINGS

The invention will be further understood from the following detailed description of a preferred embodiment taken in conjunction with an appended drawing, in which:

FIG. 4 is a flow diagram for fabricating the SLC spacer-connector and providing signal paths to interconnect the modules on the stacked boards.

DESCRIPTION OF PREFERRED EMBODIMENT

Figure 1:
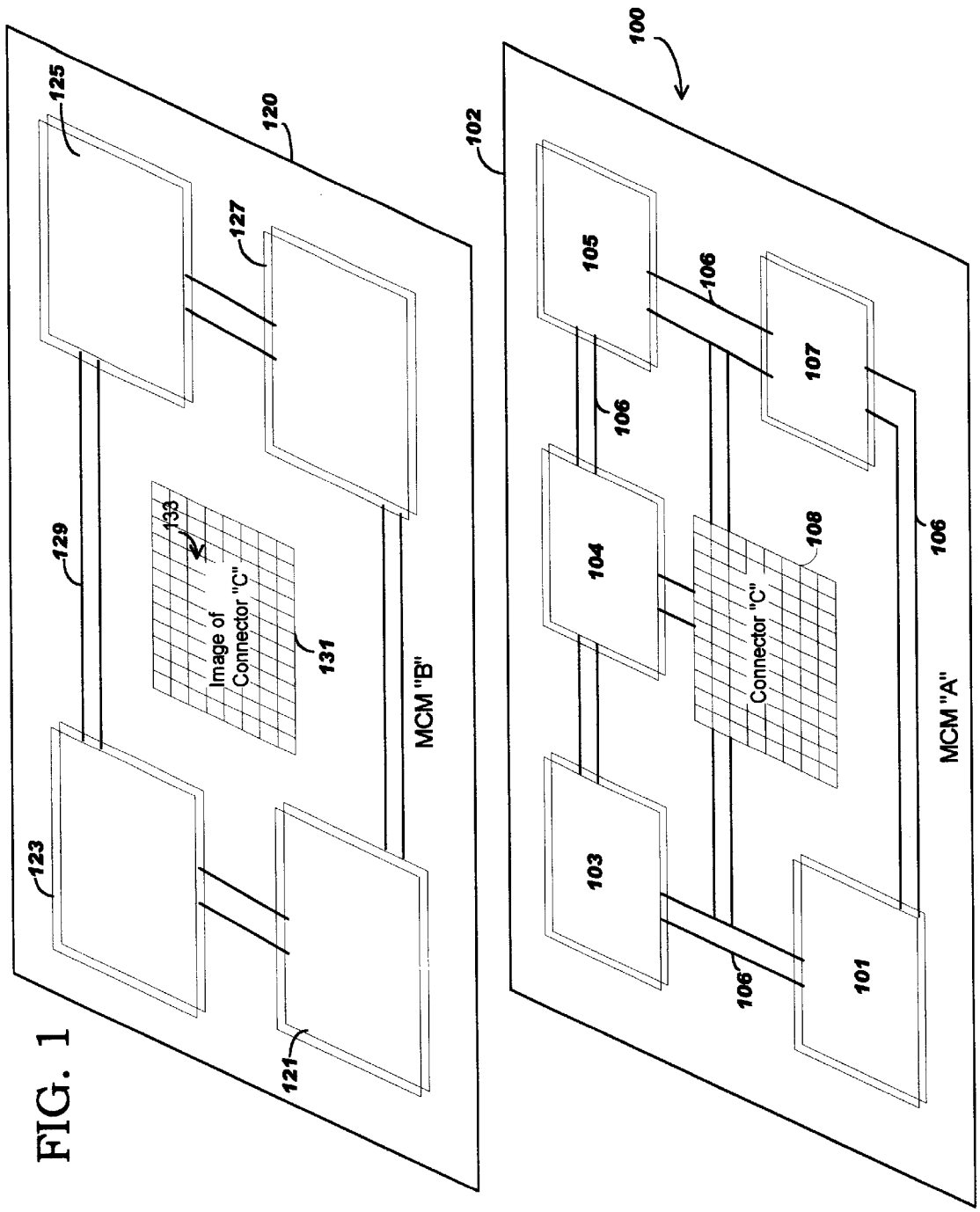
FIG. 1 is a plan view of a multi-chip module SLC board and a designated location(s) for accommodating a spacer-connector(s).

In FIG. 1, a multichip module circuit board 100 comprises a dielectric member 102. In one embodiment, the member is a glass epoxy substrate, covered by a copper layer which is patterned by selective etching to form a wiring layer, including a signal wiring conducting layer 106. A photosensitive thermal setting resin in a solvent is applied to the surface to form an insulating resin layer. The solvent is evaporated from the resin by a pre-cure heating, followed by an exposure and development step to form photo via holes in the board. Thereafter, the resin is cured and the surface of the resin layer is planarized by grinding to provide a flat Surface for subsequent processing as circuitization. The process for forming the substrate is more fully described in U.S. Pat. No. 5,766,825 assigned to the assignee of the present invention and fully incorporated herein by reference.

An assembly of components, 101, 103, 104, 105 and 107 are attached to the circuit board 102, using well-known surface mount techniques for passive components and flip chip or solder ball reflow techniques for active components. The components are interconnected by the wiring pattern 106 formed in the board as previously described. A wiring array 108 is formed on the board to receive a spacer-connector to be described hereinafter. The wiring array is connected to the wiring pattern and arranged in a matrix to match solderball contacts installed on the spacer-connector. The location of the wiring is centrally located on the board 102. However, other locations may be selected on the board 102 according to the disposition of components attached to an overlying board, (not shown). Alternatively, a plurality of wiring arrays may be formed on the board for connection to several spacer-connectors.

Figure 2:
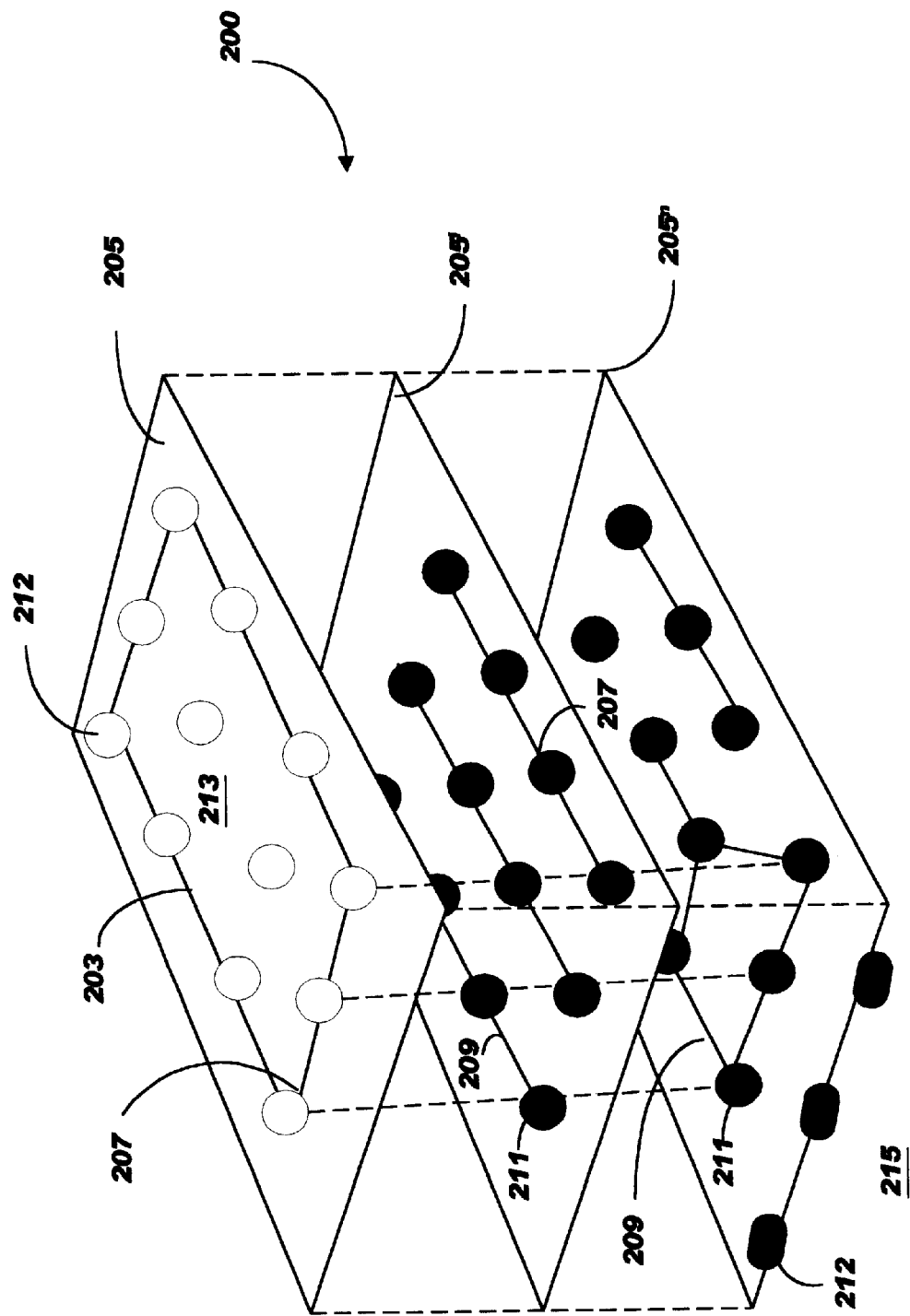
FIG. 2 is a representation of a spacer-connector for spacing and providing signal paths interconnecting the SLC board of FIG. 1 to a superposed OR overlying SLC multi chip module board.

In FIG. 2, a spacer connector 200 is constructed from stacked dielectric members 205, typically glass epoxy printed circuit board material with a build-up of surface laminar circuitization 203 as described in U.S. Pat. No. 5,766,825 for the circuit board 102 (FIG. 1). The top and bottom laminates of the spacer connector 200 have a spatial array of contact points 207 consistent with IBM C4 solder ball connection technology which permits 4 mil solder balls to be on a 9 mil pitch or 3 mil solder balls to be on a 6 mil pitch. IBM solder ball technology is described in U.S. Pat. No. 5,118,027 issued Jun. 2, 1992, assigned to the same assignee as that of the present invention and fully incorporated herein by reference. The intervening dielectric members 205 include conductive paths 209 and plated through-holes 211 in alignment with the overlying and underlying contact points 207 thereby forming signal paths between laminates and enabling power or ground line to fan out to many contact points. The spacer connector may also include power and ground reference planes (not shown) to provide a greater control of signal impedance characteristics. Solder ball reflow contacts 212 are installed on the contact points 207 at the top and bottom laminates 205 to form a top contact footprint 213 and a bottom contact footprint 215. The bottom contact points 215 mechanically and electrically connects the spacer-connector 200 to the circuit board 102 (See FIG. 1) when pressed against the array 108 and heated to form a solder joint. The height of the spacer connector 200 is selected to be greater than twice the thickness of an active or passive component attached to the circuit board 102.

Returning to FIG. 1, a second circuit board 120 is separately fabricated in accordance with the process described in U.S. Pat. No. 5,766,825 and includes active and/or passive components 121, 123, 125, 127 attached to the under surface of the board 120 using surface mount or flipped chip techniques. The components 121 . . . 127 are interconnected electrically by wiring pattern 129. An area 131 is reserved on the board for a wiring array 133 for attachment of a spacer connector. The board 120 also includes electrically inter-connected active and passive components (See FIG. 3) attached to the upper of the board 120 which may be disposed about a mirror image of wiring array 133 for attachment to another spacer. connector 200. The components on the upper and lower surfaces of the board 120 may be electrically inter-connected by solder via holes (not shown) formed in the board.

Figure 3:
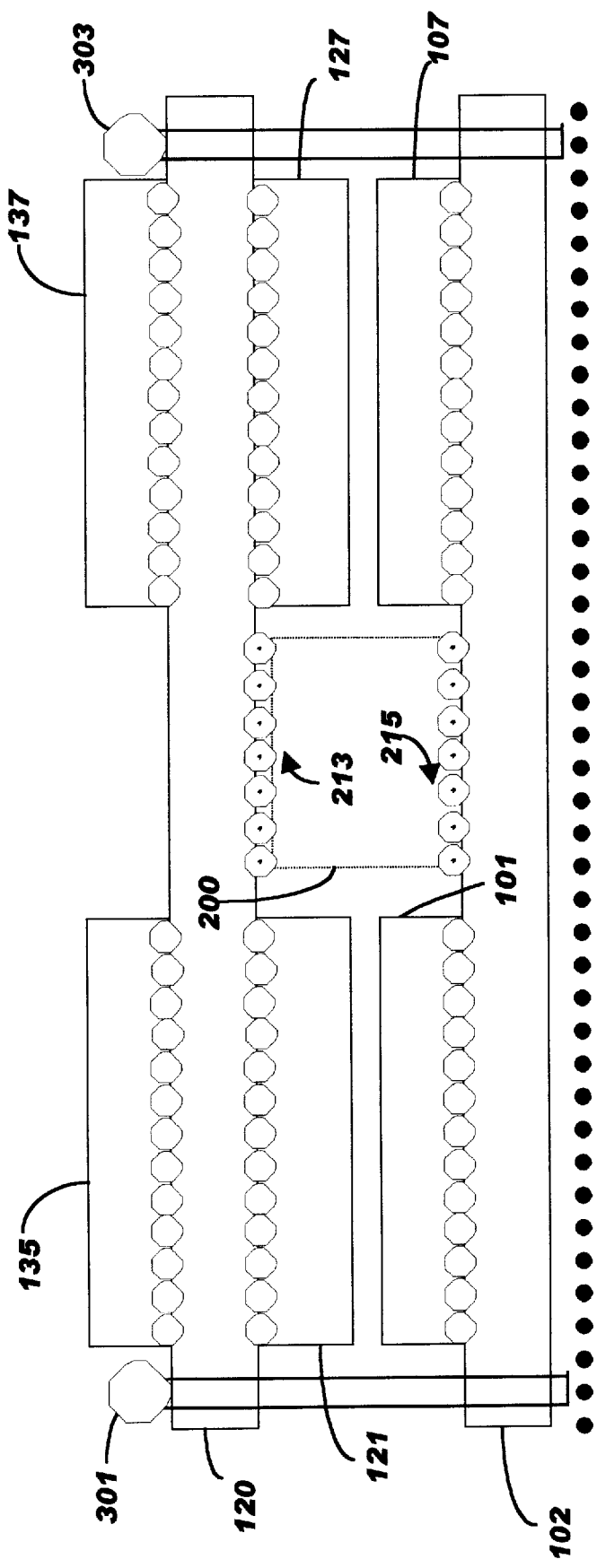
FIG. 3 is a representation of stacked SLC multi-chip modules boards including the spacer-connector of FIG. 2 for interconnecting the modules on the stacked SLC boards and incorporating the principles of the present invention.

In FIG. 3, the circuit board 120 with active and passive components 121, 127, 135 and 137 disposed on top and bottom surfaces and joined to the circuit board by solder ball reflow contacts 139, is mechanically aligned with circuit board 102 such that the solder ball contact footprint 213 (See FIG. 2) on the spacer 200 is aligned with the mirror image of wiring array 133 included in the circuit board 120. After alignment, the circuit board 120 is mechanically pressed against the spacer connector solder ball contacts 211 (See FIG. 2) 112 to form a stacked assembly. Thereafter, the entire assembly is heated causing the solder ball footprint 213 of the spacer connector to become soldered to the mirror image of the wiring array 133 on the circuit board 120. A solder hierarchy can also be employed such that the solid joint between the circuit board 102 and the connector spacer does not reflow when the top surface of the spacer connector is joined to the circuit board 120. Alternatively, the underside of the circuit board 120 could be locally heated at the wiring array causing only the solder associated with the spacer connector to melt. Mechanically supports 301, 303 can be installed at the corers or in other appropriate places to keep the stacked array of circuit boards in a rigid state.

FIG. 4 describes a process 400 for fabricating the stacked array of circuit boards shown in FIG. 3, as follows:

Step 1 Circuit board 102 is fabricated using SLC technology.

Step 2: A wiring pattern is formed on the surface of the circuit board for attachment and interconnection of active and passive components, mounted by surface mounted techniques or solder ball reflow techniques.

Step 3: A wiring array is formed on the board preferably at the center of the board and matching standard solder ball reflow patterns.

Step 4: A plurality of dielectric laminates including wiring patterns and plated throughholes are fabricated where the plated throughholes are spatially arranged to match the standard solder ball reflow patterns.

Step 5: Stacking the laminates to form a compressed block as a spacer connector having (1) a thickness greater than twice the height of the active/passive components attached to a circuit board and (2) top and bottom surfaces of the spacer connector having an array of plated throughholes with a footprint compatible with solder ball reflow patterns.

Step 6: Installing the solder ball contacts in the plated throughhole footprints on the top and bottom surfaces of the spacer connector.

Step 7: Attaching the bottom surface of solder ball contacts on the spacer connector to the wiring pattern on the circuit board 102 using standard solder ball reflow processes.

Step 8: Fabricating a second dielectric circuit board, including a wiring pattern for interconnecting attached active and passive components on both sides of the circuit board.

Step 9: Forming a wiring array on the lower surface of the circuit board and preferably disposed in the center of the board and matching a standard solder ball reflow pattern.

Step 10: Superimposing and mechanically aligning the second board with the first circuit board such that the wiring array on the second board aligns with the solder reflow contacts on the spacer connector.

Step 11: Pressing the second board against the spacer connector followed by heating solder ball contacts to establish a solder reflow contact between the second board and the spacer connector without weakening the strength of the solder ball connection between the lower surface of the spacer connector and the first circuit board.

While the invention has been described in conjunction with preferred embodiments, various changes can be made without departing from the spirit and scope of the invention, as defined in the appended claims, in which:

We claim:

1. A method of fabricating a stacked array of multi-chip modules comprising
   (a) forming a first multi-chip module (MCM);
   (b) attaching surface-mounted components to the MCM;
   (c) forming a spacer-connector stud comprising a plurality of dielectric laminates including circuitization patterns with connections between the circuit patterns of the laminates, the spacer-connector stud having a height greater than the height of the surface mounted components attached to the first MCM;
   (d) forming thermal contacts on upper and lower surfaces of the spacer-connector stud;
   (e) attaching the spacer-connector stud to the first MCM at a connection point;
   (f) forming a second MCM including surface-mounted components and an array of terminal contacts; and
   (g) aligning and connecting the contacts of the second MCM to the thermal contacts of the spacer-connector stud whereby the first and second MCMs are spaced apart and signal paths are established through the first and second MCMs via the spacer-connector stud.

2. The method of claim 1 further comprising:
attaching a plurality of space-connector studs attached to the first MCM.

3. The method of claim 1 further comprising:
forming contact footprints at the first and second MCM connections.

4. The method of claim 1, further comprising:
forming conductive paths and plated through holes in the dielectric laminates of the spacer-connector stud.

5. The method of claim 1 further comprising:
pressing the second MCM contacts against the spacer-connector stud contacts to form a mechanical connection.

6. The method of claim 5 further comprising:
heating the contact areas of the spacer-connector stud to physically connect them to the first and second MCM contacts.

7. The method of claim 1 further comprising:
forming a solder hierarchy on the first and second MCMs between the surface mounted component connections to the first and second MCMs and the connections of the spacer-connector connections to the first and second MCMs.

8. The method of claim 1 wherein the connector-spacer has a height greater than twice the height of the components attached to the first MCM.

9. The method of claim 1 further comprising:
attaching components to the tipper and lower surfaces of the second MCM.

10. The method of claim 1 wherein the dielectric laminates are glass-epoxy.

11. A method of fabricating a stacked array of multi-chip modules comprising:
   (a) forming a first multi-chip module (MCM);
   (b) attaching surface-mounted components to the MCM;
   (c) forming a spacer-connector stud comprising a plurality of dielectric laminates including circuitization patterns with connections between the circuit patterns of the laminates, the spacer-connector stud having a height greater than the height of the surface mounted components attached to the first MCM;
   (d) forming thermal contacts on upper and lower surfaces of the spacer-connector stud;
   (d1) forming power and ground reference planes on the dielectric laminates in the spacer-connector stud;
   (e) attaching the spacer-connector stud to the first MCM at a connection point;
   (f) forming a second MCM including surface-mounted components and an array of terminal contacts; and
   (g) aligning and connecting the contacts of the second MCM to the thermal contacts of the spacer-connector stud whereby the first and second MCMs are spaced apart and signal paths are established through the first and second MCMs via the spacer-connector stud.

12. A method of fabricating a stacked array of multi-chip modules comprising:
   (a) forming a first multi-chip module (MCM);
   (b) attaching surface-mounted components to the MCM;
   (c) forming a spacer-connector stud comprising a plurality of dielectric laminates including circuitization patterns with connections between the circuit patterns of the laminates, the spacer-connector stud having a height greater than the height of the surface mounted components attached to the first MCM;

(d) forming thermal contacts on upper and lower surfaces of the spacer-connector stud;

(e) attaching the spacer-connector stud to the first MCM at a connection point;

(f) forming a second MCM including surface-mounted components and an array of terminal contacts;

(g) aligning and connecting the contacts of the second MCM to the thermal contacts of the spacer-connector stud whereby the first and second MCMs are spaced apart and signal paths are established through the first and second MCMs via the spacer-connector stud; and (h) installing support elements interconnecting the first and second MCMs at the edges thereof.

13. A method of fabricating a stacked array of multi-chip modules comprising:

(a) forming a first multi-chip module (MCM);

(b) attaching surface-mounted components to the MCM;

(c) forming a spacer-connector stud comprising a plurality of dielectric laminates including circuitization patterns with connections between the circuit patterns of the laminates, the spacer-connector stud centrally located on the first MCM and having a height greater than the height of the surface mounted components attached to the first MCM;

(d) forming thermal contacts on upper and lower surfaces of the spacer-connector stud;

(e) attaching the spacer-connector stud to the first MCM at a connection point;

(f) forming a second MCM including surface-mounted components and an array of terminal contacts; and (g) aligning and connecting the contacts of the second MCM to the thermal contacts of the spacer-connector stud whereby the first and second MCMs are spaced apart and signal paths are established through the first and second MCMs via the spacer-connector stud.

14. A method of fabricating a stacked array of multi-chip modules comprising:

(a) forming a first multi-chip module (MCM);

(b) attaching surface-mounted components to the MCM:

(c) forming a spacer-connector stud comprising a plurality of dielectric laminates including circuitization patterns with connections between the circuit patterns of the laminates, the spacer-connector stud having a height greater than the height of the surface mounted components attached to the first MCM;

(d) forming thermal solder reflow contacts on upper and lower surfaces of the spacer-connector stud;

(e) attaching the thermal solder reflow contacts of the spacer-connector stud to the first MCM at a connection point;

(f) forming a second MCM including surface-mounted components and an array of terminal contacts; and (g) aligning and connecting the contacts of the second MCM to the thermal solder reflow contacts of the spacer-connector stud whereby the first and second MCMs are spaced apart and signal paths are established through the first and second MCMs via the spacer-connector stud.

15. The method of claim 14 wherein the contacts at one end of the spacer-connector stud joined to the first MCM do not reflow when the contacts at the other end of the spacer-connector stud are joined to the connections of the second MCM.

* * * * *